(12) United States Patent
Tromp

(10) Patent No.: US 7,453,062 B2
(45) Date of Patent: Nov. 18, 2008

(54) ENERGY-FILTERING CATHODE LENS MICROSCOPY INSTRUMENT

(75) Inventor: Rudolf M. Tromp, North Salem, NY (US)

(73) Assignee: International Business Machines Corporation, Armonk, NY (US)

( * ) Notice: Subject to any disclaimer, the term of this patent is extended or adjusted under 35 U.S.C. 154(b) by 228 days.

(21) Appl. No.: 11/364,298

(22) Filed: Feb. 28, 2006

(65) Prior Publication Data

US 2007/0200062 A1    Aug. 30, 2007

(51) Int. Cl.
*H01J 37/05* (2006.01)
(52) U.S. Cl. ............ 250/305; 250/310; 250/396 R
(58) Field of Classification Search ......... 250/305
See application file for complete search history.

(56) References Cited

U.S. PATENT DOCUMENTS 5,319,207 A * 6/1994 Rose et al. ........... 250/396 R
6,002,740 A * 12/1999 Cerrina et al. ............ 378/43
7,022,987 B2 * 4/2006 Preikszas et al. ......... 250/310

* cited by examiner

*Primary Examiner*—David A. Vanore
*Assistant Examiner*—Phillip A Johnston
(74) *Attorney, Agent, or Firm*—Ido Tuchman; Ryan, Mason & Lewis, LLP

(57) ABSTRACT

An energy filtering microscopy instrument is provided. An objective lens is disposed for reception of electrons in order to form an electron diffraction pattern in a backfocal plane of the objective lens. An entrance aperture disposed in the backfocal plane of the objective lens for filtering a slice of the electron diffraction pattern. A magnetic deflector has an entrance plane and an exit plane. The entrance aperture is disposed in the entrance plane. The magnetic deflector is disposed to receive the slice of the electron diffraction pattern and project an energy dispersed electron diffraction pattern to the exit plane. An exit aperture is disposed in the exit plane of the magnetic deflector for selection of desired electron energy of the energy dispersed electron diffraction pattern.

21 Claims, 5 Drawing Sheets

✱ DIFFRACTION PLANES
➤ IMAGE PLANES

ENERGY-FILTERING CATHODE LENS MICROSCOPY INSTRUMENT

CROSS REFERENCE TO RELATED APPLICATIONS

This application is related to the U.S. patent application Ser. No. 11/364,299, entitled "Aberration-Correcting Cathode Lens Microscopy Instrument," which is filed concurrently herewith and incorporated by reference herein.

FIELD OF THE INVENTION

The present invention relates generally to electron microscopy and, more particularly, to a simplified energy filtering electron microscopy instrument.

BACKGROUND OF THE INVENTION

Low energy electron microscopy (LEEM) and photo electron emission microscopy (PEEM) are both examples of cathode lens microscopy, in which a strong electric field is maintained between a sample under study and an objective lens of a microscope. In such instruments, the sample is considered the cathode and the objective lens is considered the anode. Electrons are reflected from the sample in the case of a LEEM instrument, or photo-emitted by the sample in case of a PEEM instrument, at low energy, for example, less than 500 eV. The electrons are accelerated into the objective lens, reaching an energy of 10-30 keV. Subsequently, these electrons are utilized to form an image of the sample on a viewing screen.

The backfocal plane of the objective lens of the microscope provides an image of the angular distribution of the electrons, which contains information on the arrangement of the atoms in the outer layers of the sample. This image is considered a low energy electron diffraction (LEED) pattern for LEEM, or a photo electron diffraction (PED) pattern for PEEM. The energy distribution of these electrons may also contain information about the electronic and chemical nature of the surface under study.

Energy filtering of the electrons allows an operator to view an image of the sample at a specified electron energy corresponding to, for example, the binding energy of electrons of a particular chemical element. Alternatively, by operating projector and spectrometer lenses of the microscope at a different excitation, the energy filtered PED pattern may be observed. The combination of an energy filtering cathode lens microscopy instrument with synchrotron radiation provides the operator with an extremely powerful analytical tool in the study of surface and interface structure and composition.

A schematic view of a typical energy filtering combination LEEM/PEEM instrument is provided in FIG. 1. In an LEEM instrument, an electron gun generates an electron beam 102 at, for example, 15 keV electron energy. Condenser lenses 104 focus electron beam 102. A magnetic field in a magnetic deflector 106 deflects electron beam 102 over a large angle, for example, 60 degrees. This deflection directs electron beam 102 into an objective lens 108 and to a sample 110. After a reflection of electron beam 102 from sample 110, the electrons retrace their path, forming a LEED pattern in a backfocal plane 112 of objective lens 108, and a real space image of the sample in a center of magnetic deflector 106. The electrons are then deflected into a projector column 114 of the microscope.

Alternatively, in a PEEM instrument, sample 110 is illuminated with ultra violet (UV) light or soft x-ray photons 117 to generate photo electrons from sample 110. In this embodiment the electron gun is not utilized. Backfocal plane 112 contains a PED pattern, and a real space image of the sample is again formed in the center of magnetic deflector 106.

Projector column 114 contains lenses 116 for magnification of the image or the diffraction pattern onto a viewing screen 118. Additionally, projector column 114 contains an electrostatic or magnetic electron spectrometer 120 together with necessary coupling lenses 122 to energy filter the electrons. Coupling lenses 122 serve to select either the image or the diffraction pattern for energy filtering. If the image is to be filtered, the diffraction pattern is located at a spectrometer entrance aperture 124. Spectrometer 120 focuses the diffraction pattern onto an exit aperture 126. Different electron energies are deflected over different angles in spectrometer 120, and dispersed across exit aperture 126. Thus, exit aperture 126 selects electrons over a narrow energy range, corresponding to the width of the aperture, blocking electrons outside this range. Projector lenses 116 on the exit side of spectrometer 120 serve to magnify the energy filtered real space image and project it onto viewing screen 118.

To obtain an energy filtered diffraction pattern, spectrometer coupling lenses 122 focus the real space image on spectrometer entrance aperture 124. Spectrometer 120 again focuses this image onto exit aperture 126, while dispersing the electrons according to their energy. Exit aperture 126 selects a narrow energy range, and the projector lenses on the exit side of spectrometer 120 now magnify the diffraction pattern onto viewing screen 118.

To change from an energy filtered image to an energy filtered diffraction pattern, a large change in the excitations and focal lengths of spectrometer coupling lenses 122 is required on both the entrance and exit sides of spectrometer 120. In some cases, this may add up to six electron lenses to the microscopy instrument. Spectrometer 120 is a relatively complex piece of hardware, and the setup of the instrument is of great complexity and cost.

SUMMARY OF THE INVENTION

The present invention provides a simplified energy filtering cathode lens microscopy instrument and, more specifically, a simplified energy filtering combined LEEM/PEEM instrument.

For example, in one aspect of the present invention, an energy filtering microscopy instrument is provided. An objective lens is disposed for reception of electrons. The objective lens is configured to form an electron diffraction pattern in a backfocal plane of the objective lens. An entrance aperture is disposed in the backfocal plane of the objective lens for filtering a slice of the electron diffraction pattern. A magnetic deflector has an entrance plane and an exit plane. The entrance aperture is disposed in the entrance plane. The magnetic deflector is disposed to receive the slice of the electron diffraction pattern and project an energy dispersed electron diffraction pattern to the exit plane. An exit aperture is disposed in the exit plane of the magnetic deflector for selection of desired electron energy of the energy dispersed electron diffraction pattern.

In this embodiment of the present invention, the microscopy instrument may further comprise a projection column disposed to receive and magnify a selected electron energy of the energy dispersed electron diffraction pattern from the exit aperture, and a viewing screen for display of at least one of the selected electron energy diffraction pattern and a real space image from the projection column. Further, the energy filtering microscopy instrument may comprise a low energy electron microscopy instrument or a photo electron emission microscopy instrument. The entrance aperture may be adjustable or moveable.

In another aspect of the present invention, a method of energy filtering in an electron microscopy instrument is provided. Energy filtering of the image and of the diffraction pattern is a desirable feature in combined LEEM/PEEM instruments. Present generation instruments realize energy filtering by the incorporation of an electron spectrometer and associated electron lenses in the projector column of the microscope, at great expense. The present invention describes a simplified solution which eliminates the energy filter, and reduces the cost by a significant margin.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

As will be illustrated in detail below, the present invention introduces a simplified energy filtering cathode lens microscopy instrument. The simplified electron microscopy instrument described in the embodiments of the present invention utilizes the magnetic deflector field at the heart of the LEEM/PEEM instrument, obviating the need for an electron spectrometer and associated coupling lenses. To enable energy filtering of either a real space image or a diffraction pattern, the backfocal plane of the objective lens is fitted with a movable and adjustable aperture.

In modern LEEM/PEEM instruments the magnetic deflector field consists of a prism array, more specifically, a combination of several electromagnets that produce desired electron optical properties. Most designs exhibit chromatic dispersion, in which electrons with different energies are deflected over different angles, but achromatic designs also exist. For the purposes of the present invention, a prism array with chromatic dispersion is desirable.

Figure 1:
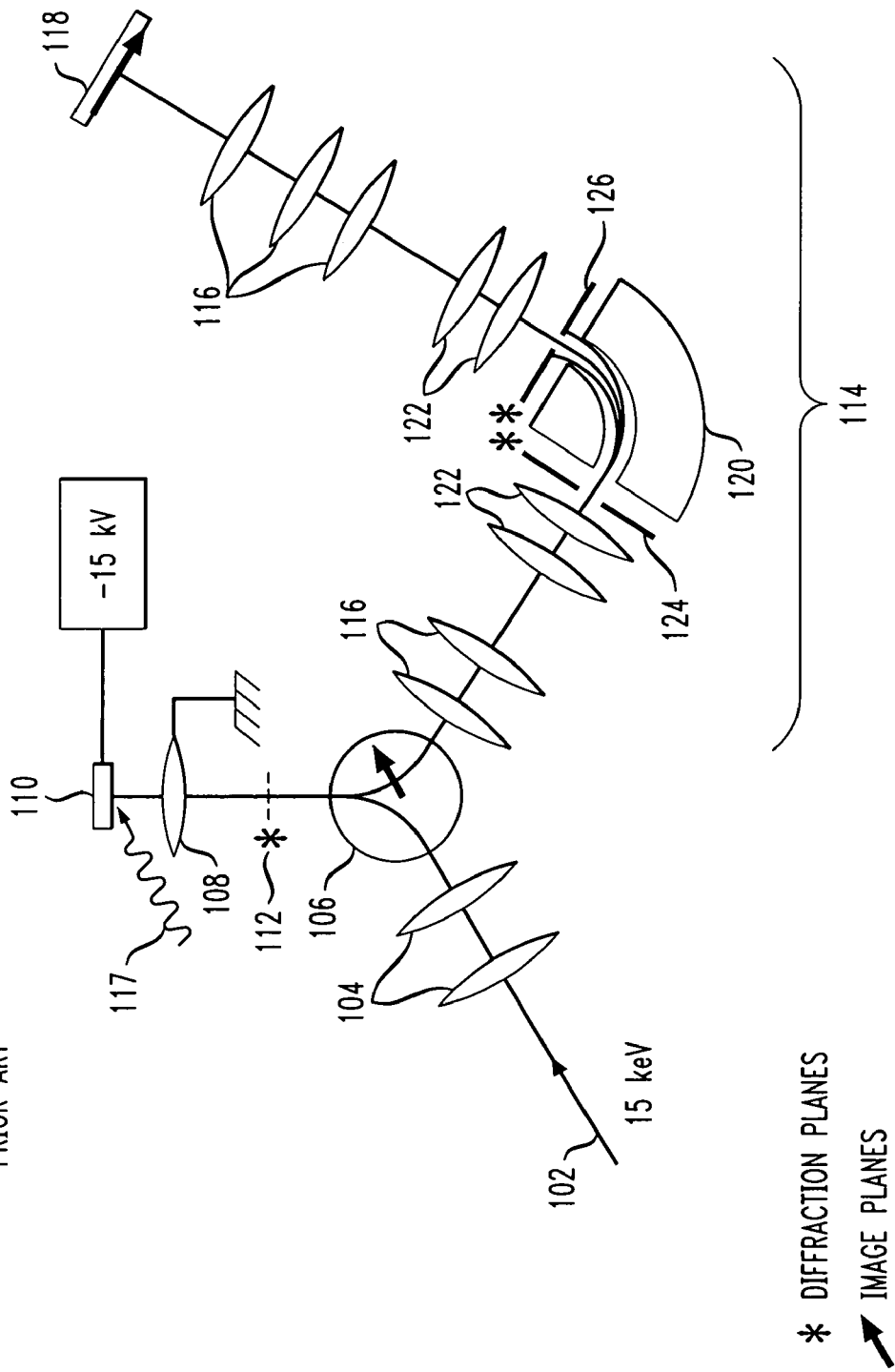
FIG. 1 is a diagram illustrating an energy filtered LEEM/PEEM instrument.
Figure 2:
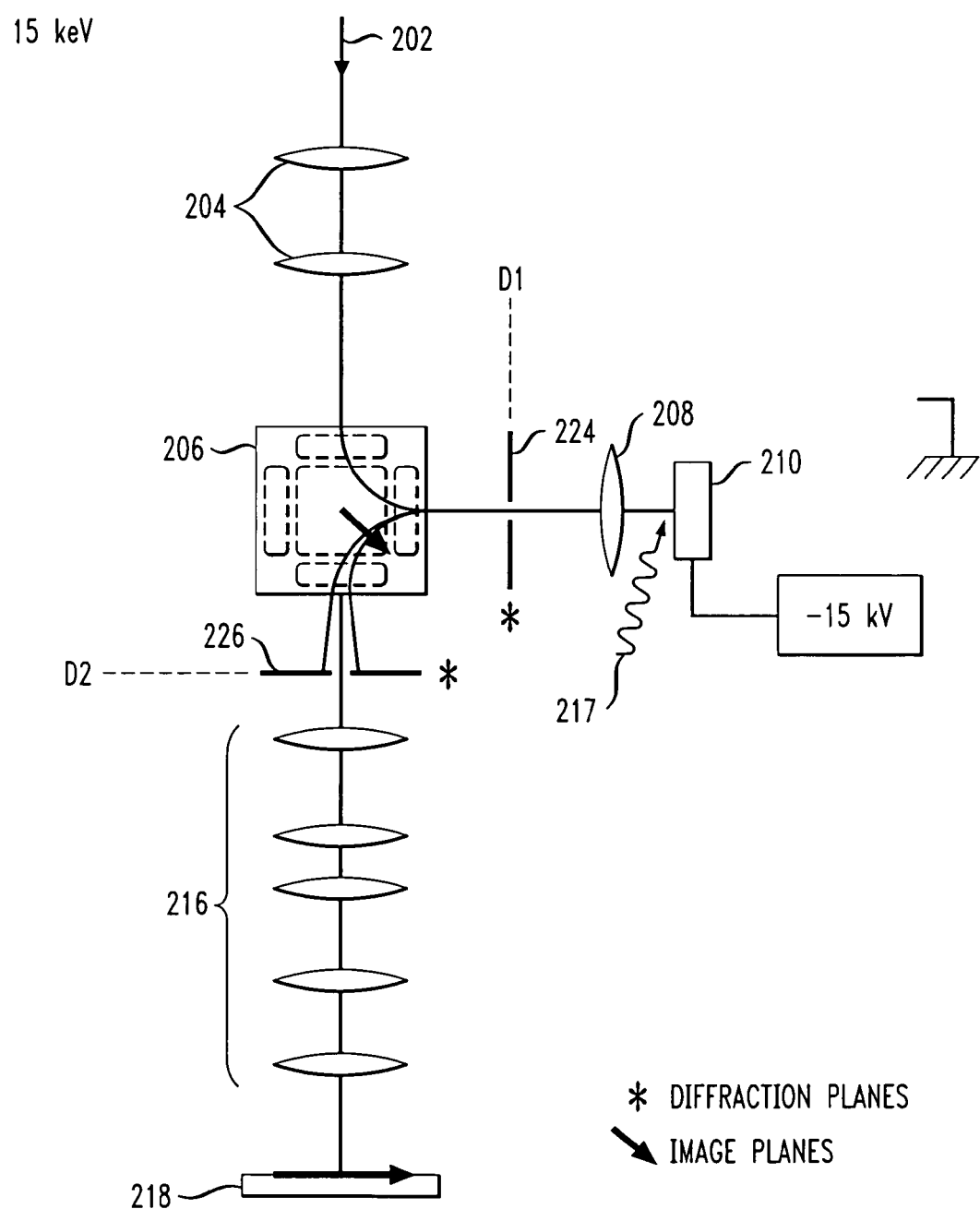
FIG. 2 is a diagram illustrating a simplified energy filtered LEEM/PEEM instrument, according to an embodiment of the present invention.

Referring now to FIG. 2, a diagram illustrates an energy filtering LEEM/PEEM instrument, according to an embodiment of the present invention. As described above with regard to FIG. 1, an electron gun generates an electron beam 202 at, for example, 15 keV electron energy. Condenser lenses 204 focus electron beam 202 into a magnetic deflector 206. Magnetic deflector 206 consists of two parallel plates, between which the electrons are deflected. Each plate of magnetic deflector 206 preferably contains five electromagnets, although designs with either fewer or more electromagnets are also possible.

Magnetic deflector 206 deflects electron beam 202 over a large angle, for example, 90 degrees in this embodiment of the present invention, directing it to an objective lens 208 for reflection from a sample 210. Alternatively, in a PEEM instrument, sample 210 may be illuminated 217 as described above to generate photo electrons. Electrons from sample 210 form a diffraction pattern in a backfocal plane of objective lens 208 and a real space image of sample 210 in a diagonal plane of the prism array of magnetic deflector 206.

Outside of the prism array exists four symmetric planes of special significance. An object placed in plane D1 is transferred at unit magnification to plane D2. The backfocal plane of objective lens 208 is positioned to coincide with plane D1, enabling a diffraction pattern to be observed in plane D2. The diffraction pattern is energetically dispersed in plane D2, and not achromatic. Thus, planes D1 and D2 are substantially similar to the entrance and exit planes of the electron spectrometer of FIG. 1.

Energy filtering of the real space image is provided through the placement of a suitable entrance aperture 224 in plane D1, preferably taking a slice across the diffraction pattern. The width of this aperture will determine the achievable energy resolution in plane D2. For image filtering the slice cuts across the microscope optical axis so as to minimize optical aberrations. In plane D2 the slice is re-imaged by the prism array, and also dispersed in energy. The dispersive direction contains the energy spectrum. An exit aperture 226 in plane D2 selects the desired electron energy, and projector lenses 216 magnify the energy filtered real space image of sample 210 onto a viewing screen 218.

Figure 3:
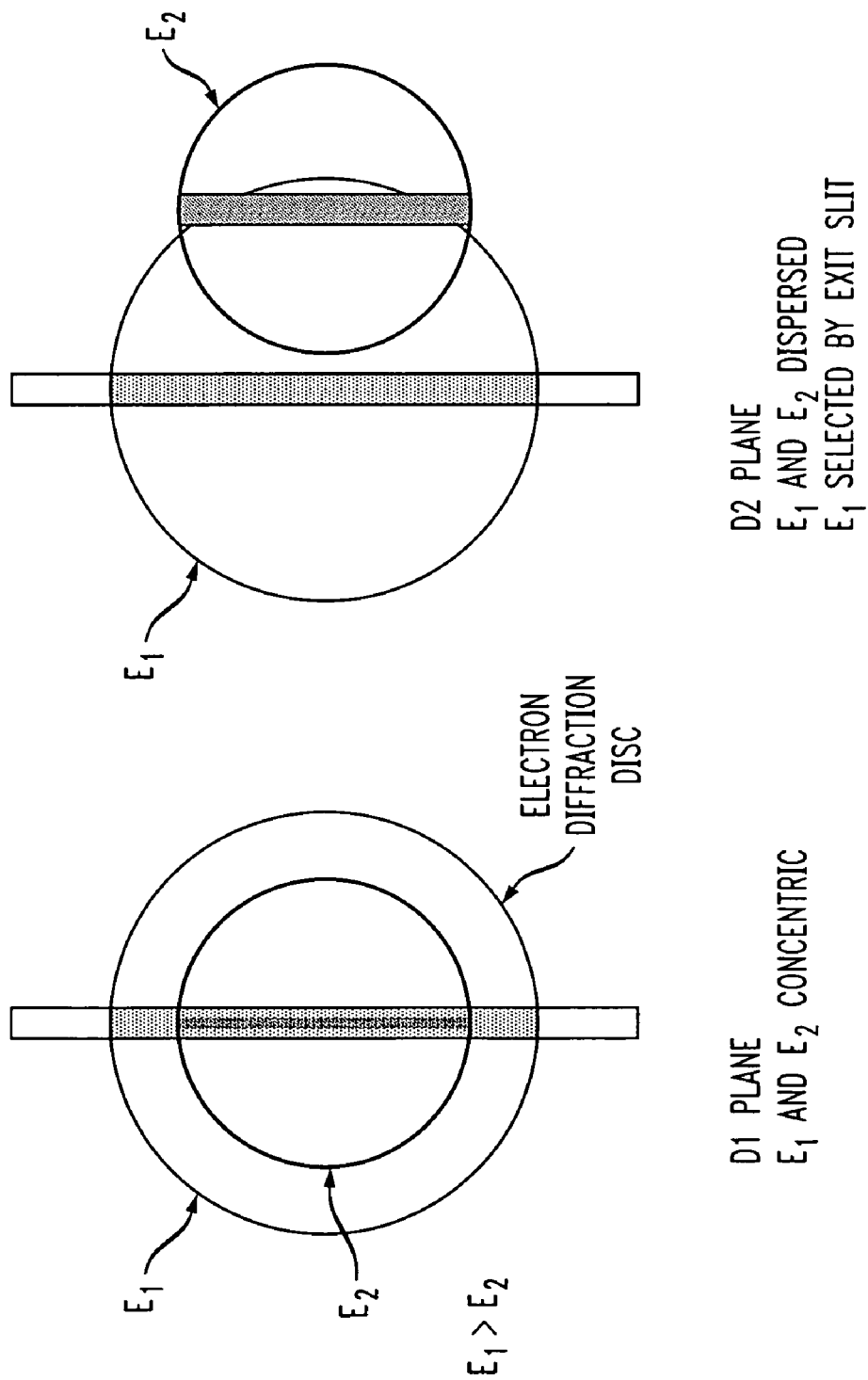
FIG. 3 is a diagram illustrating discrete energies at planes D1 and D2 of the LEEM/PEEM instrument of FIG. 2, according to an embodiment of the present invention.

In the embodiments of the present invention shown in FIG. 2, an energy filtered diffraction pattern can be obtained without changing any of the lens settings, other than the diffraction lens in the projector column, which switches between diffraction and image plane in the usual fashion. Referring now to FIG. 3, a diagram illustrates discrete energies at planes D1 and D2 of the electron microscopy instrument, according to an embodiment of the present invention. FIG. 3 assumes for simplicity that the energy spectrum of the electrons contains only two discrete energies $E_1$ and $E_2$, with $E_1 > E_2$. Due to the difference in energy the electron diffraction disc at $E_1$ is larger than at $E_2$. In the backfocal plane of the objective lens, plane D1 in FIG. 2, these two discs are concentric. In plane D2 of FIG. 2, due to energy dispersion, $E_2$ is displaced relative to $E_1$. An aperture placed in plane D1 gives rise to the presence of two lines of intensity in plane D2, corresponding to $E_1$ and $E_2$.

Figure 4:
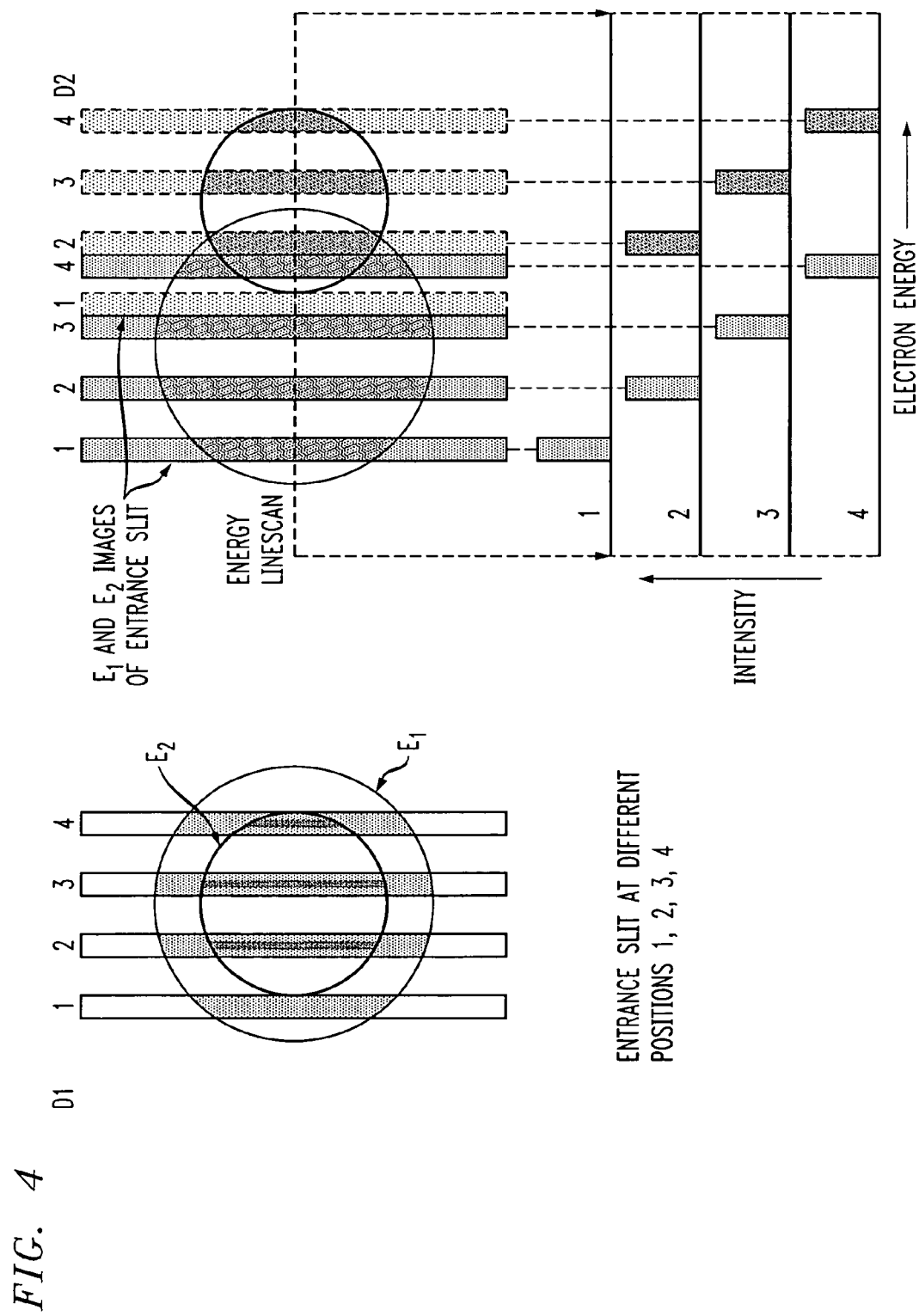
FIG. 4 is a diagram illustrating discrete energies at planes D1 and D2 of the LEEM/PEEM instrument of FIG. 2 for different entrance aperture positions, according to an embodiment of the present invention.

Referring now to FIG. 4, a diagram illustrates discrete energies at planes D1 and D2 of the electron microscopy instrument for different entrance aperture positions, according to an embodiment of the present invention. As the aperture in plane D1 is scanned across the diffraction discs, the dispersed lines corresponding to $E_1$ and $E_2$ are also scanned across D2. The projector lenses project D2 onto the viewing screen. As the entrance aperture is scanned across plane D1 the dispersed image of the slice in D2 may be recorded from the viewing screen with a video acquisition system, one image for each position of the entrance aperture. The complete diffraction discs for $E_1$ and $E_2$ can easily be reconstructed from these video recordings by digital computer, for both $E_1$ and $E_2$.

Figure 5:
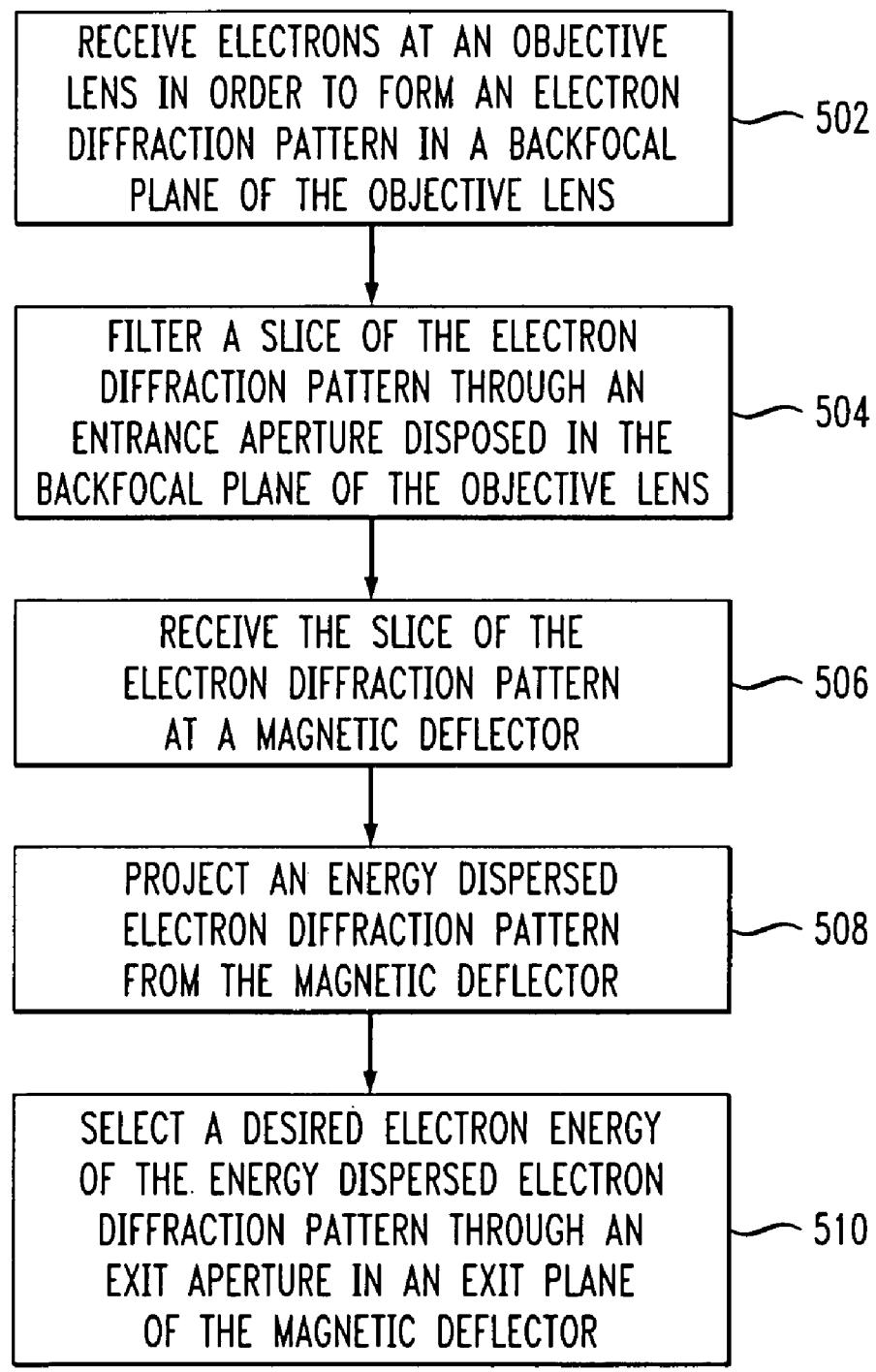
FIG. 5 is a flow diagram illustrating an energy filtering methodology in an electron microscopy instrument, according to an embodiment of the present invention.

Referring now to FIG. 5, a flow diagram illustrates an energy filtering methodology in an electron microscopy instrument, according to an embodiment of the present invention. The methodology begins in block 502 where electrons are received at an objective lens in order to form an electron diffraction pattern in a backfocal plane of the objective lens. In block 504, a slice of the electron diffraction pattern is filtered through an entrance aperture disposed in the backfocal plane of the objective lens. In block 506, a magnetic deflector receives the slice of the electron diffraction pattern, and in block 508, the magnetic deflector projects an energy dispersed electron diffraction pattern. In block 510, a desired electron energy of the energy dispersed electron diffraction pattern is selected through an exit aperture in an exit plane of the magnetic deflector, terminating the methodology.

Blocks 504-510 may be repeated for a plurality of entrance aperture positions across the electron diffraction pattern and energy-dispersed images may be recorded for reconstruction of an energy filtered diffraction pattern.

This method works not only for a spectrum consisting of discrete lines, but also for continuous spectra. The dispersed slice image contains continuous energy distributions; however the method does not change. Energy filtered diffraction patterns may be reconstructed for all energies within the range projected onto the viewing screen. For instance, an energy filtered and background corrected PED pattern for an atomic core level can be obtained by obtaining energy filtered PED's at the core level energy, and at energies just above and below the core level energy to determine the background, and by making a suitable background correction to the energy filtered core level PED.

Since none of the lens excitations are changed to obtain the energy filtered diffraction pattern, the real space image is also located at the (achromatic) diagonal plane of the prism array. Energy filtered PED's can be obtained for a selected area in the sample image by placing a selected area aperture in this fixed image plane.

Due to low signal levels it may be difficult to focus and stigmate the sample image for a photo electron energy of interest. For example, when the photo electrons have a kinetic energy of 50 eV, a LEEM image with high image intensity may be obtained with 50 eV electrons. The system is properly aligned, focused and stigmated for these conditions in LEEM mode. 50 eV electrons are reflected from the sample to form the LEEM image. To obtain the 50 eV PEEM image, turn off the electron source; turn on the UV light source to generate the 50 eV photo electrons. Again, 50 eV electrons leave the sample, along with electrons at lower and higher energy due to the continuous photoelectron energy distribution. An aperture is provided in plane D1 and aligned with the optical axis, which may be viewed directly by magnifying plane D2. The energy selection aperture in plane D2 and the energy filtered 50 eV PEEM image can be observed on the screen, focused and stigmated. This technique may be utilized for any other photo electron energy as well.

If it is desirable to obtain an image at another energy next, for example, 70 eV kinetic energy, the sample potential is lowered by 20 V, so that the final kinetic energy of the electrons after acceleration remains unchanged. The 70 eV photo electrons will now follow the exact same path through the prism array as the 50 eV electrons did before. The objective lens may need to be slightly re-focused, but the apertures in D1 and D2 remain unchanged. Thus, photoelectron kinetic energy can be selected simply by changing the sample potential. This makes problems of background correction very simple, by bracketing the image at the desired photo electron energy with images just above and below this energy to perform a suitable image background subtraction by digital computer.

In conclusion, through the placement of a movable entrance aperture in plane D1 on the optical axis and an energy selection aperture in plane D2 an energy filtered image may be obtained. The entrance aperture may be moved across the diffraction in plane D1 and the energy-dispersed image of the D2 plane may be recorded with a suitable image or video acquisition system. The energy spectrum is obtained by projection of the image intensity on the energy axis which runs parallel to the dispersion direction. Alternatively, an energy spectrum may be obtained for a selected area in the sample image by placing a selected area aperture in the fixed image plane on the diagonal plane of the prism array and recording the energy dependent image intensity at the selected area.

Further, an energy filtered diffraction pattern may be obtained by scanning the entrance aperture across the diffraction of plane D1, and by recording the energy-dispersed images of the scanned aperture in plane D2 with a suitable video acquisition system. A digital computer reconstructs the energy filtered diffraction pattern from the recorded data. Alternatively, energy filtered diffraction data may be obtained for a selected area in the sample image by placing a selected area aperture in the fixed image plane located on the diagonal plane of the prism array.

The magnetic deflection field may be embodied differently than a magnetic prism array. Other designs are conceivable. For instance, suitable magnetic field distributions may be obtained by careful shaping of the pole pieces. However, it is necessary for the magnetic deflection field to display dispersion in the D1/D2 planes. Additionally, it is not necessary that the deflection angle be 90 degrees. Other angles may work just as well. An important practical advantage of 90 degrees deflection is that the electron gun and the viewing screen are in line, greatly easing microscope alignment. A vertical electron column also displays better mechanical stability. While the diffraction pattern in planes D1 and D2 are placed with unit magnification between them, this is not strictly necessary. Other sets of planes with different magnifications would show different dispersions. From a practical point of view, the placement of D1 and D2 for a resulting unit magnification is particularly simple due to its high symmetry.

While scanning with the aperture across the diffraction pattern in plane D1 mechanically is particularly simple, other scanning methods, such as electromagnetic or electrostatic scanning methods may work equally well. For instance, the aperture in plane D1 may be held fixed on the optical axis and the diffraction pattern scanned across it. This would not change the filtering capabilities presented in this invention.

The objective lens system may comprise more than a single lens. For example, an objective lens may be coupled with a transfer lens to form a rotation-free doublet. In that case, the diffraction plane of the transfer lens, containing either the LEED or PED pattern, is again placed in the D1 plane, and the real space image formed by the transfer lens is again placed on the diagonal plane of the magnetic deflector.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An energy filtering microscopy instrument comprising:
   an objective lens disposed for reception of electrons, the objective lens being configured to form an electron diffraction pattern in a backfocal plane of the objective lens;
   an entrance aperture disposed in the backfocal plane of the objective lens for filtering a slice of the electron diffraction pattern;

a magnetic deflector having an entrance plane and an exit plane, wherein the entrance aperture is disposed in the entrance plane and the magnetic deflector is disposed to receive the slice of the electron diffraction pattern and project an energy dispersed electron diffraction pattern to the exit plane; and an exit aperture disposed in the exit plane of the magnetic deflector for selection of desired electron energy of the energy dispersed electron diffraction pattern.

2. The energy filtering microscopy instrument of claim 1, wherein the entrance aperture is at least one of adjustable and moveable.

3. The energy filtering microscopy instrument of claim 1, wherein the magnetic deflector is configured to deflect the electron diffraction pattern approximately 90 degrees.

4. The energy filtering microscopy instrument of claim 1, further comprising:

a projection column disposed to receive and magnify a selected electron energy of the energy dispersed electron diffraction pattern from the exit aperture; and a viewing screen for projection of at least one of the magnified selected electron energy diffraction pattern and a real space image from the projection column.

5. The energy filtering microscopy instrument of claim 1, wherein the energy filtering microscopy instrument comprises a low energy electron microscopy instrument and further comprising:

an electron gun generating an electron beam at a specified electron energy;

one or more condenser lenses disposed to receive and focus the electron beam from the electron gun into the magnetic deflector;

wherein the magnetic deflector deflects the electron beam onto a surface of a sample for electron reflection to the objective lens.

6. The energy filtering microscopy instrument of claim 5, wherein the magnetic deflector deflects the electron beam through the entrance aperture and the objective lens before reaching the surface of the sample.

7. The energy filtering microscopy instrument of claim 5, wherein the magnetic deflector deflects the electron beam approximately 90 degrees.

8. The energy filtering microscopy instrument of claim 1, wherein the energy filtering microscopy instrument comprises a photo electron emission microscopy instrument, and further comprising:

at least one of an ultra violet light source and a soft x-ray photon source for illumination of a sample to generate photo electrons to the objective lens.

9. The energy filtering microscopy instrument of claim 1, wherein the magnetic deflector comprises a prism array having electromagnets to produce specified electron optical properties.

10. The energy filtering microscopy instrument of claim 9, wherein the prism array is configured to form a real space image corresponding to the electron diffraction pattern in a diagonal plane within the prism array.

11. The energy filtering microscopy instrument of claim 9, wherein the prism array is configured for chromatic dispersion.

12. The energy filtering microscopy instrument of claim 9, wherein the prism array comprises:

two parallel plates, perpendicular to the entrance and exit planes of the magnetic deflector, and between which electrons are deflected, wherein each of the two parallel plates comprises a plurality of electromagnets.

13. The energy filtering microscopy instrument of claim 12, wherein each of the two parallel plates comprise five electromagnets.

14. The energy filtering microscopy instrument of claim 1, wherein the entrance plane and exit plane of the magnetic deflector are disposed for unit magnification of the electron diffraction pattern.

15. The energy filtering microscopy instrument of claim 1, wherein the entrance aperture is configured to filter a slice from an optical axis.

16. A method of energy filtering in an electron microscopy instrument comprising the steps of:

receiving electrons at an objective lens in order to form an electron diffraction pattern in a backfocal plane of the objective lens;

filtering a slice of the electron diffraction pattern at an entrance aperture disposed in the backfocal plane of the objective lens;

receiving the slice of the electron diffraction pattern at a magnetic deflector having an entrance plane and an exit plane, wherein the entrance aperture is disposed in the entrance plane;

projecting an energy dispersed electron diffraction pattern in the exit plane of the magnetic deflector; and selecting a desired electron energy of the energy dispersed electron diffraction pattern at an exit aperture disposed in the exit plane of the magnetic deflector.

17. The method of claim 16, further comprising the step of magnifying an energy filtered image onto a viewing screen.

18. The method of claim 16, further comprising the steps of:

repeating the filtering, receiving, projecting, selecting and magnifying steps for a plurality of entrance aperture positions across the electron diffraction pattern; and recording energy-dispersed images to obtain an energy spectrum.

19. The method of claim 16, further comprising the step of magnifying an energy filtered diffraction pattern onto a viewing screen.

20. The method of claim 16, further comprising the steps of:

repeating the filtering, receiving, projecting, selecting and magnifying steps for a plurality of entrance aperture positions across the electron diffraction pattern; and recording energy-dispersed images for reconstruction of an energy filtered diffraction pattern.

21. The method of claim 16, further comprising the step of magnifying a dispersed energy spectrum on a viewing screen.

* * * * *